(12) United States Patent
Ramírez Fernández et al.

(10) Patent No.: US 9,908,164 B2
(45) Date of Patent: Mar. 6, 2018

(54) SHEET METAL FORMING PROCESS AND SYSTEM

(71) Applicant: EXPAL SYSTEMS S.A, Madrid (ES)

(72) Inventors: Francisco Javier Ramírez Fernández, Albacete (ES); Rosario Domingo Navas, Madrid (ES)

(73) Assignee: EXPAL SYSTEMS S.A., Madrid (ES)

( * ) Notice: Subject to any disclaimer, the term of this patent is extended or adjusted under 35 U.S.C. 154(b) by 71 days.

(21) Appl. No.: 14/395,098

(22) PCT Filed: Apr. 18, 2013

(86) PCT No.: PCT/ES2013/070249
§ 371 (c)(1),
(2) Date: Oct. 17, 2014

(87) PCT Pub. No.: WO2013/156656
PCT Pub. Date: Oct. 24, 2013

(65) Prior Publication Data
US 2015/0082853 A1    Mar. 26, 2015

(30) Foreign Application Priority Data

Apr. 19, 2012  (ES) .................................. 201230585

(51) Int. Cl.
*B21D 22/28* (2006.01)
*B21D 22/22* (2006.01)
(Continued)

(52) U.S. Cl.
CPC ............. *B21D 22/28* (2013.01); *B21D 22/22* (2013.01); *B21D 51/54* (2013.01); *F42B 33/00* (2013.01); *G06F 17/5009* (2013.01)

(58) Field of Classification Search
CPC ...... B21D 22/20; B21D 22/206; B21D 22/22; B21D 22/24; B21D 22/28; B21D 22/30;
(Continued)

(56) References Cited

U.S. PATENT DOCUMENTS 2,915,424 A   12/1959  Lyon
3,058,195 A   10/1962  Ericsson
(Continued)

FOREIGN PATENT DOCUMENTS

CN     1406395 A    3/2003
CN   101208817 A    6/2008
(Continued)

OTHER PUBLICATIONS

Rubio, E.M. et al.; "Analysis of plate drawing processes by the upper bound method using theoretical work-hardening materials," The International Journal of Advanced Manufacturing Technology, 2009, pp. 261-269, vol. 40.
(Continued)

*Primary Examiner* — A. Dexter Tugbang
*Assistant Examiner* — Joshua D Anderson
(74) *Attorney, Agent, or Firm* — Tristan A. Fuierer; Moore & Van Allen, PLLC

(57) ABSTRACT

The invention relates to a method and system for forming a metal sheet, preferably in the form of a disc, in order to obtain an essentially cylindrical and essentially hollow end metal part having a base thickness that is essentially greater than the thickness of its walls. More specifically, the invention relates to the metalworking sector and, in particular, to the production of ammunition cases or shells.

8 Claims, 9 Drawing Sheets

(51) Int. Cl.
*B21D 51/54* (2006.01)
*F42B 33/00* (2006.01)
*G06F 17/50* (2006.01)

(58) Field of Classification Search
CPC ...... B21D 24/005; B21D 24/04; B21D 24/06;
B21D 24/08; B21D 51/26; B21D 51/54;
B21K 21/04; B21K 21/06; F42B 33/00;
G06F 17/5009; G06F 17/5018; G06F
2217/41; G06F 2217/42
USPC ... 72/284, 347–350, 370.14, 370.24, 370.25,
72/379.2, 384, 404; 86/19.5, 19.6; 703/2
See application file for complete search history.

(56) References Cited

U.S. PATENT DOCUMENTS

| | | | |
|---|---|---|---|
| 3,553,994 | A | 1/1971 | Monestam |
| 3,614,816 | A | 10/1971 | Weyhmuller et al. |
| 4,038,859 | A | 8/1977 | Pavleszek |
| 4,200,051 | A | 4/1980 | Nakahara et al. |
| 4,296,536 | A * | 10/1981 | Hicke .................. B21D 22/21 86/19.5 |
| 4,412,440 | A * | 11/1983 | Phalin .................. B21D 22/22 72/349 |
| 7,287,408 | B2 * | 10/2007 | Kawai .................. B21D 22/28 72/349 |
| 2003/0003355 | A1 | 1/2003 | Ueda et al. |
| 2009/0068557 | A1 | 3/2009 | Sakashita et al. |

FOREIGN PATENT DOCUMENTS

| | | |
|---|---|---|
| DE | 2743642 A1 | 3/1978 |
| FR | 2154359 A1 | 5/1973 |
| GB | 1136500 A | 12/1968 |
| GB | 2201915 A | 9/1988 |
| JP | S5348071 A | 5/1978 |
| KR | 20000043810 A | 7/2000 |
| WO | 0013815 A1 | 3/2000 |
| WO | 03035298 A1 | 5/2003 |
| WO | 2005098073 A1 | 10/2005 |

OTHER PUBLICATIONS

International Search Report, dated Sep. 4, 2013.

* cited by examiner

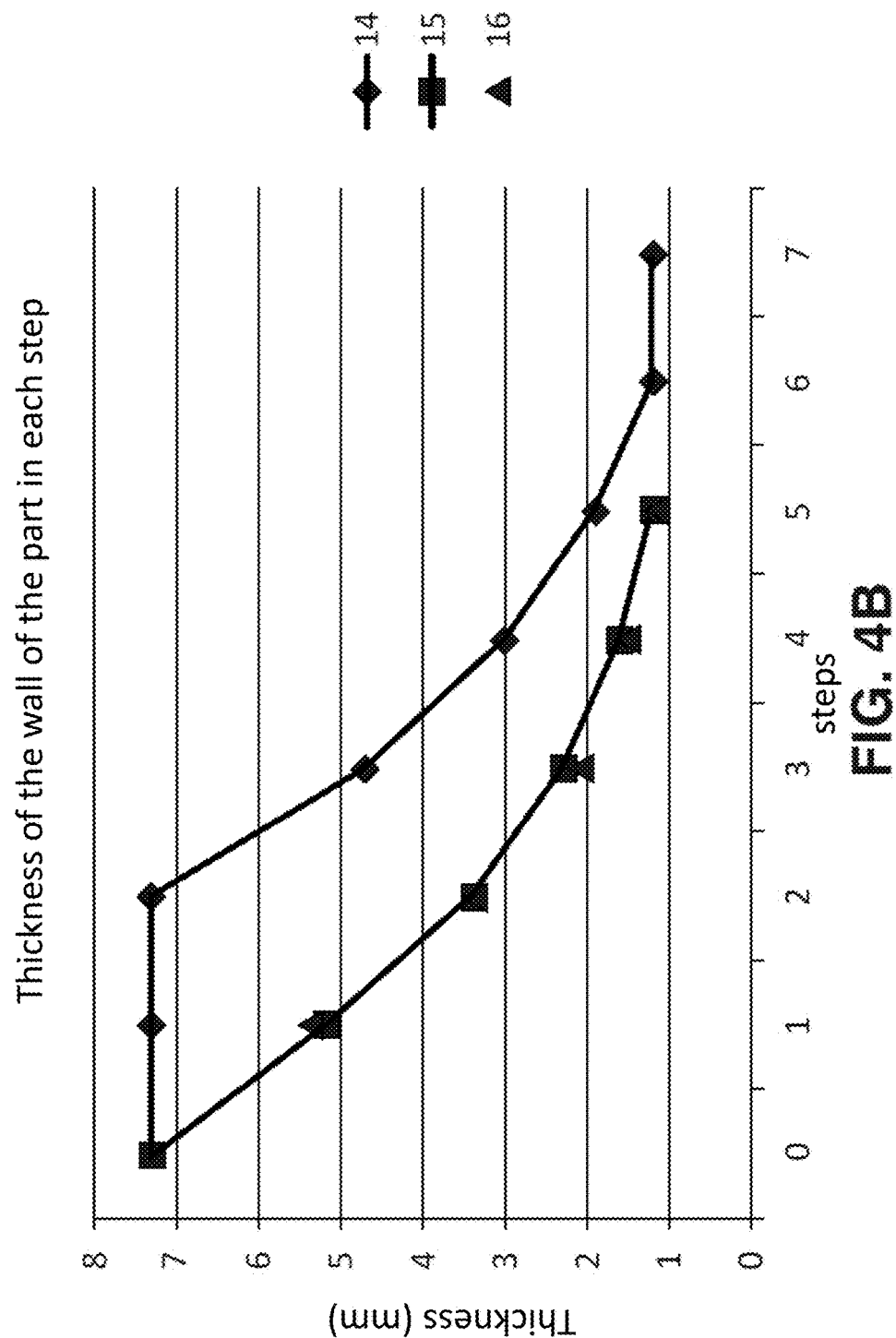

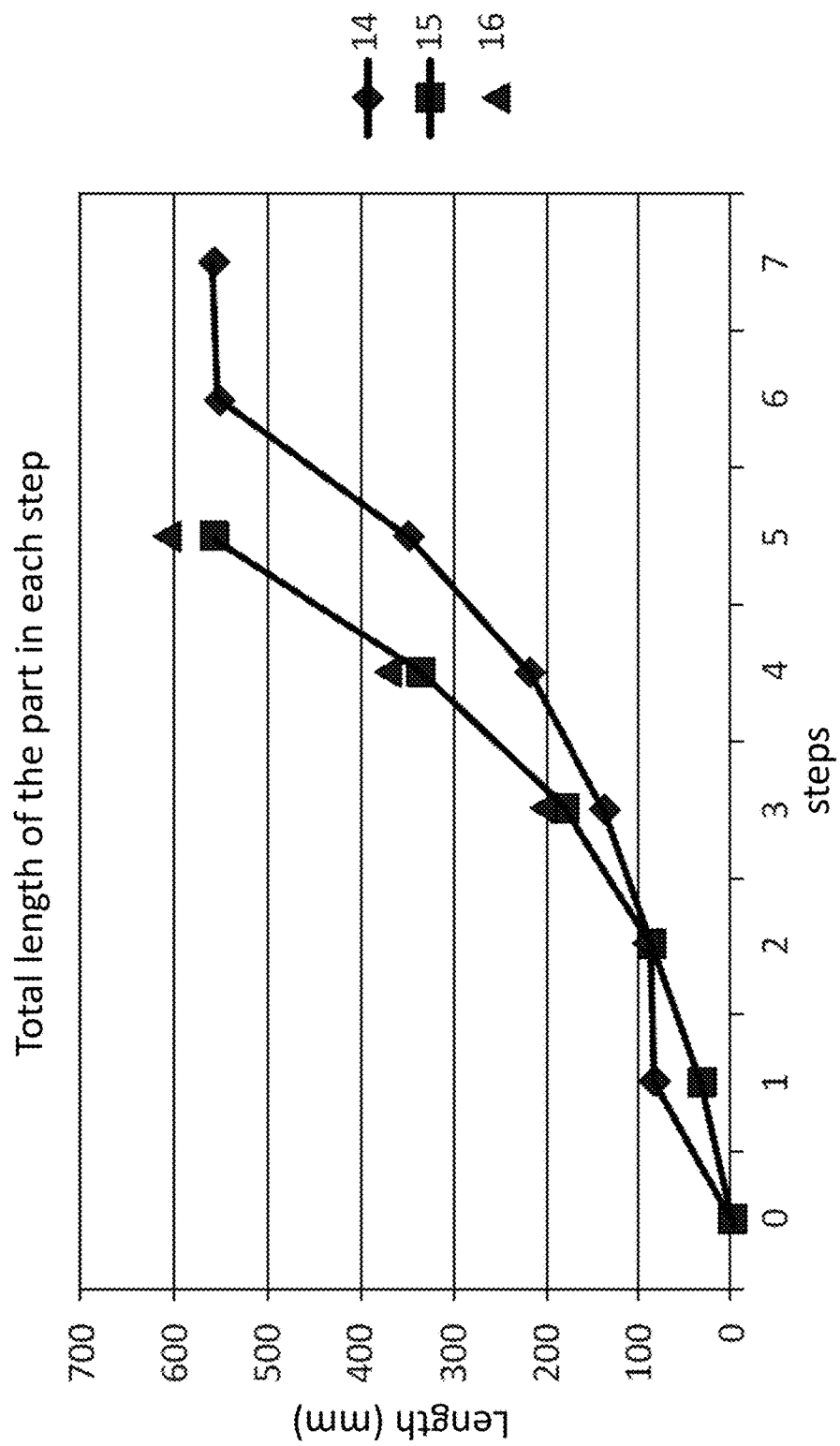

SHEET METAL FORMING PROCESS AND SYSTEM

CROSS-REFERENCE TO RELATED APPLICATIONS

This application is filed under the provisions of 35 U.S.C. § 371 and claims the priority of International Patent Application No. PCT/ES2013/070249 filed on 18 Apr. 2013 entitled "SHEET METAL FORMING PROCESS AND SYSTEM" in the name of Francisco Javier RAMÍREZ FERNÁNDEZ, et al., which claims priority to Spanish Patent Application No. P201230585 filed on 19 Apr. 2012, both of which are hereby incorporated by reference herein in their entirety.

OBJECT OF THE INVENTION

The present invention relates to a forming method and system for obtaining an essentially cylindrical and essentially hollow final metal part, with a thickness of the bottom that is essentially greater than the thickness of its walls, from a preferably disc-shaped sheet metal. The invention is specifically comprised in the metal working sector, and more specifically in the manufacture of ammunition cartridge cases.

BACKGROUND OF THE INVENTION

Deep drawing is a technique that allows obtaining from planar and essentially thin sheet metal with a specific thickness an object the shape of which is predetermined and is essentially cylindrical and hollow. In this process, the sheet is deep drawn in a deep drawing die by the mechanical action of a punch.

Multistage deep drawing is characterized by being a process comprising several consecutive deep drawing and redrawing operations. Deep drawing is the action of mechanically deforming planar sheet metal against the deep drawing die with the aid of the punch. Redrawing comprises repeated deep drawing stages in which the part is gradually deformed iteratively until reaching the desired final shape.

Sometimes an ironing process is applied after deep drawing stages. Ironing is characterized by being a process which allows reducing the thickness of the wall of the previously deep drawn part and consists of passing the previously deep drawn part through an ironing die.

In the metal working sector, the manufacture of ammunition cartridge cases is done by first performing the deep drawing operations to obtain the inner shape of the part and to subsequently reduce the thickness of the walls and increase the length of the part by means of successive ironing operations. The deep drawing, redrawing and ironing stages are fundamentally defined by means of design rules based on the empirical tests without taking into account the plastic evolution of the material and without considerations concerning the combination of stages or optimization of the process.

The present invention provides a different process that allows manufacturing final parts with different design parameters and an optimized process that substantially improves the results obtained up until now.

This invention is based on the contributions made in the articles entitled "*The development of competencies in manufacturing engineering by means of a deep-drawing tool*", "*Prediction of the limiting drawing ratio and the maximum drawing load in cup-drawing*", "*On multistage deep drawing of axisymmetric components*" and "*Energía de estirado en deformación homogénea*". The definition of new methods based on aided design capable of improving some results has been the object of patents, such as U.S. Pat. No. 7,623,939 B2 "Method of design a tool for deep drawing and tool for deep drawing of sheet metal", based on parameterized geometry and on meeting quality criteria.

DESCRIPTION OF THE INVENTION

The present invention provides a process that is different from the process of the state of the art that allows manufacturing final parts with different design parameters, leading to a lower process cost and lower power consumption by basing the dependence of the latter on the manufacturing forces, work and time. The invention describes a sheet metal forming process for obtaining an essentially cylindrical and essentially hollow final metal part according to claim 1 and a sheet metal forming system according to claim 6.

In the context of the present invention the term "forming" refers to the forming of metal materials, i.e., the technique of giving shape to a sheet metal or metal disc to obtain a part having the desired shape and volume. "Molding" or "forming" shall be referred to indistinctly hereinafter.

A first inventive aspect relates to a sheet metal forming process for obtaining an essentially cylindrical and essentially hollow final metal part in a system comprising at least the following elements:
- a plurality of deep drawing dies to perform deep drawing and redrawing operations from sheet metal simultaneously with ironing operations in a combined manner,
- a plurality of ironing dies to perform ironing operations in each stage simultaneously with the iterated deep drawing operations,
- a plurality of blank-holder elements for holding or securing the part that is being deep drawn which allow eliminating the occurrence of creases or wrinkles in the part that is being formed,
- centering and guiding elements for centering and guiding parts through the dies,
- a plurality of punches, and
- at least some processing means suitable for giving all the preceding elements full capability to carry out the process (deep drawing and ironing force, working speed, etc.).

The process is performed in a system comprising the described elements comprised in machinery used for the process, each one performing a function in the simultaneous deep drawing and ironing process of the invention. As in the state of the art, one deep drawing die is used for each deep drawing step such that it contains the shape that will be given to the metal part to be obtained in each step. The present invention represents each step with a sign i and n steps are completed.

The punches are adapted to the inner dimensions of the inner diameters of the intermediate parts in the intermediate stages to be obtained in the combined process. Each punch in each stage i mechanically operates on the sheet or disc (first stage) or metal part (subsequent stages), first passing the part through the deep drawing die and then through the ironing die, and so on and so forth for each stage.

The blank-holder elements for holding or securing the part that is being deep drawn (securing means for securing the part) of each stage i are used to prevent the occurrence of creases or wrinkles during the combined, simultaneous deep drawing/ironing operation.

To assure that the machinery acts in a controlled manner in each stage i, processing means are used to program machinery operation with parameters such as the working pressure of the machine and the travelling speeds of the punches during the approach, operation and recovery.

The process is characterized in that it comprises i stages (i=1 . . . n) (i=1 . . . n) in which the following steps are performed:
  a) if i=1, providing the preferably disc-shaped sheet metal,
  b) if i≠1 providing an intermediate metal part from the preceding stage,
  c) providing working parameters to the processing means of the elements that are involved, such as the working pressure and the approach, operating and recovery speeds of the punch,
  d) performing a simultaneous deep drawing and ironing operations using the working parameters, making the deep drawing die, punch, ironing die and blank-holder elements work simultaneously, obtaining an essentially cylindrical and essentially hollow intermediate metal part as a result,
  e) if i≠n, repeating from step b) providing the essentially cylindrical and essentially hollow metal part obtained in d) as the metal part,
such that when i=n the essentially cylindrical and essentially hollow final metal part is obtained as a result.

If the process is performed in a mass production line, each of the previously described elements is situated in the mass production line, there being a deep drawing die, a punch, securing means, a ironing die in each step of the mass production line, and operations are carried out consecutively by completing actions a) to e) in each step of the mass production line.

The sheet metal to be formed, which is disc-shaped in one embodiment, is provided for the first step. The machinery operating parameters are programmed by means of the processing means in the first step of the mass production line.

A deep drawing and ironing operation is performed simultaneously, unlike the processes of the state of the art where the deep drawing and ironing actions are performed consecutively, one after the other.

The invention proposes the simultaneous combination of deep drawing and ironing processes such that they are performed simultaneously, i.e., the deep drawing and the ironing are no longer consecutive stages such as in the state of the art but rather are performed in a single action such that in each step, the deep drawing die, the punch, the blank-holder and the ironing die operate together, making all these elements work at the same time.

This invention therefore allows obtaining parts with less overall work performed and lower power consumption during the process as more similar forces are achieved in each stage to obtain the final part, as well as in the intermediate stages, more uniform deep drawing coefficients, reduction coefficients for the thickness of the wall and length of the part, producing fewer deformations, all with a lower manufacturing cost and overall process time, the process therefore being of maximum industrial interest.

At the end of the simultaneous deep drawing and ironing operation, an essentially cylindrical and essentially hollow intermediate metal part is provided in the first stage as a result to provide it in the subsequent stage of the mass production line. Therefore, the same is done in the second stage of the process as in the preceding stage, complying with the working parameters programmed for the second stage. The intermediate metal parts are essentially cylindrical and essentially hollow, i.e., tube-shaped with a variable and hollow section in the sense that the punch has been inserted in said parts such that a cavity remains inside with variable thickness, which thickness is considerably different for the bottom of the part and the walls, a characteristic that characterizes ammunition cartridge cases.

The desired final metal part is provided when the last stage n of the process is reached.

The number of combined deep drawing and ironing stages depends on the ratio existing between the dimensions of the sheet metal to be formed and on the dimensions of the final metal part to be obtained, on how easy the deep drawing of the material is and on the thickness of the sheet. The greater the depth to be given to the final metal part to be obtained, the more stages will be necessary for the deep drawing and ironing, and therefore more tools and operations will be needed. It is therefore necessary to envisage the way to always perform operations with the lowest number of stages. The number of stages n to be performed is conventionally determined with data provided with the experience of the person skilled in the art, but it can be the result of simulations and optimizations to achieve less overall work performed, lower power consumption during the process, and achieving more similar forces in each stage.

Ironing stages are mainly used in the state of the art to reduce the walls of parts such as tubes for automotive uses, pipes, wires, etc. Simultaneously combining deep drawing and ironing stages leads to obtaining parts the geometry of which is such that the thickness of the bottom obtained in the final part is substantially greater than the thickness of the walls, because the thickness of the walls has been gradually reduced in each step of the simultaneous deep drawing and ironing action. Therefore, it is an interesting technique in industry for parts requiring this geometry, and particularly in the manufacture of ammunition cartridge cases.

A second inventive aspect relates to a sheet metal forming system for obtaining an essentially cylindrical final metal part comprising:
  a plurality of deep drawing dies to perform deep drawing operations from sheet metal simultaneously with ironing operations in a combined manner,
  a plurality of ironing dies to perform ironing operations in each stage simultaneously with the iterated deep drawing operations,
  a plurality of blank-holder elements for holding or securing the part that is being deep drawn that allow eliminating the occurrence of creases in the part that is being deep drawn,
  centering and guiding elements for centering and guiding parts through the dies,
  a plurality of punches, and
  at least some processing means suitable for giving all the preceding elements full capability to carry out the process (deep drawing and ironing force, working speed, etc.),
characterized in that it is suitable for implementing a forming process according to the first inventive aspect.

If the process is performed in a mass production line, the system is the set of deep drawing dies, punches, ironing dies and securing means as well as the processing means suitable for programming all the described machinery.

A third inventive aspect relates to a computer program, characterized in that it comprises program code means to perform the simulation stages of a forming process.

A fourth inventive aspect relates to a computer-readable medium, characterized in that it contains a computer program comprising program code means to perform the simulation stages of a forming process.

A fifth inventive aspect relates to an electronic signal containing information, characterized in that it allows reconstructing a computer program according to the third inventive aspect.

All the technical features described in this specification (including the claims, description and drawings) can be combined in any way except for those features that are mutually exclusive.

DESCRIPTION OF THE DRAWINGS

These and other features and advantages of the invention will be better understood from the following detailed description of a preferred embodiment, given only by way of illustrative and non-limiting example in reference to the attached drawings.

FIG. 4B shows the evolution of the thickness of the wall of the part that is obtained in each step in millimeters in an experimental example.

FIG. 4C shows the evolution of the total length of the part that is obtained in each step in millimeters in an experimental example.

DETAILED DESCRIPTION OF THE INVENTION

Figure 1:
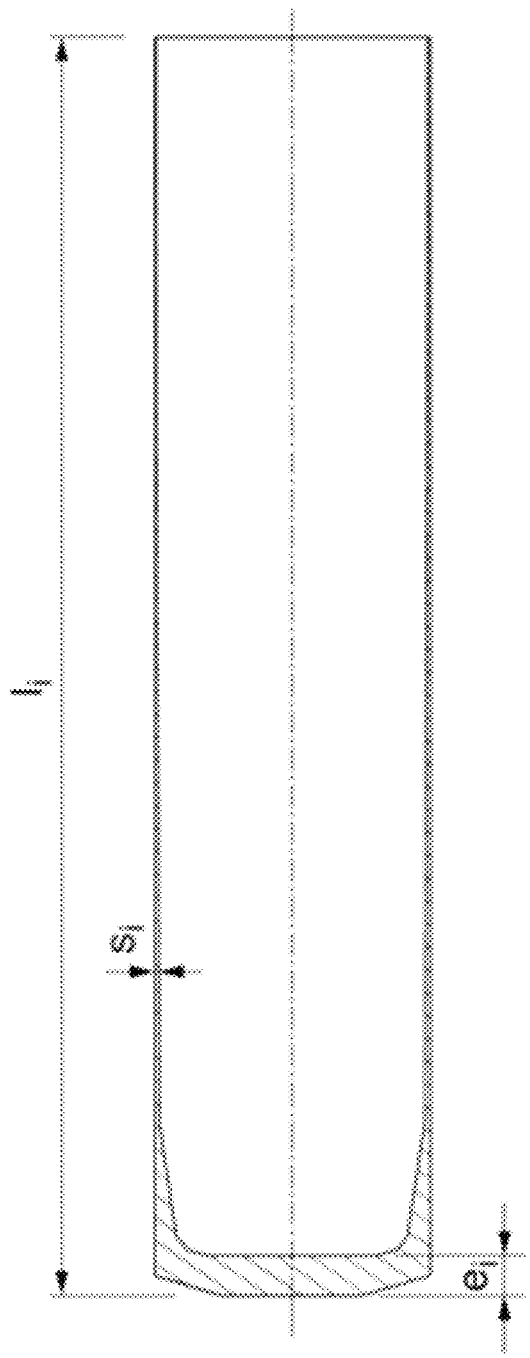
FIG. 1 shows a depiction of the geometry of an artillery cartridge case, where the thickness of the bottom is shown to be substantially greater than that of the walls.

The present invention relates to a sheet metal (1) forming process for obtaining an essentially cylindrical and essentially hollow final metal part (2). Specifically, the forming process is of interest in the manufacture of ammunition cartridge cases the particular geometry of which depicted in FIG. 1, with the thickness of the bottom greater than the thickness of the walls, allows combining deep drawing and ironing stages simultaneously for the manufacture. The invention also relates to the system where the forming process is implemented.

Sheet Metal Forming System

Figure 2:
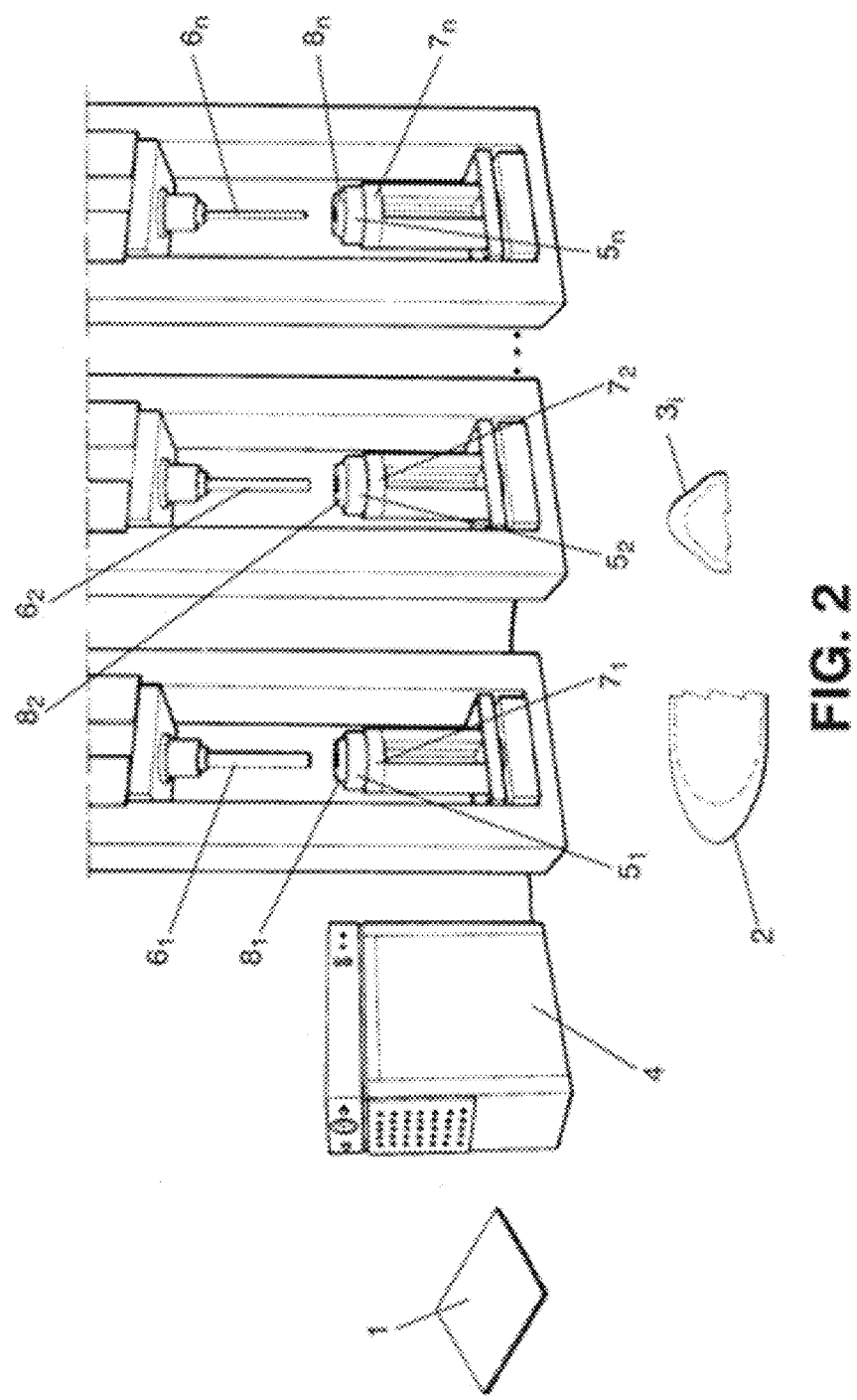
FIG. 2 depicts a mass production line for producing metal parts by a metal part forming process such as the process of the invention. The different elements used in each step of the mass production line are observed in the drawing.
Figure 3A:
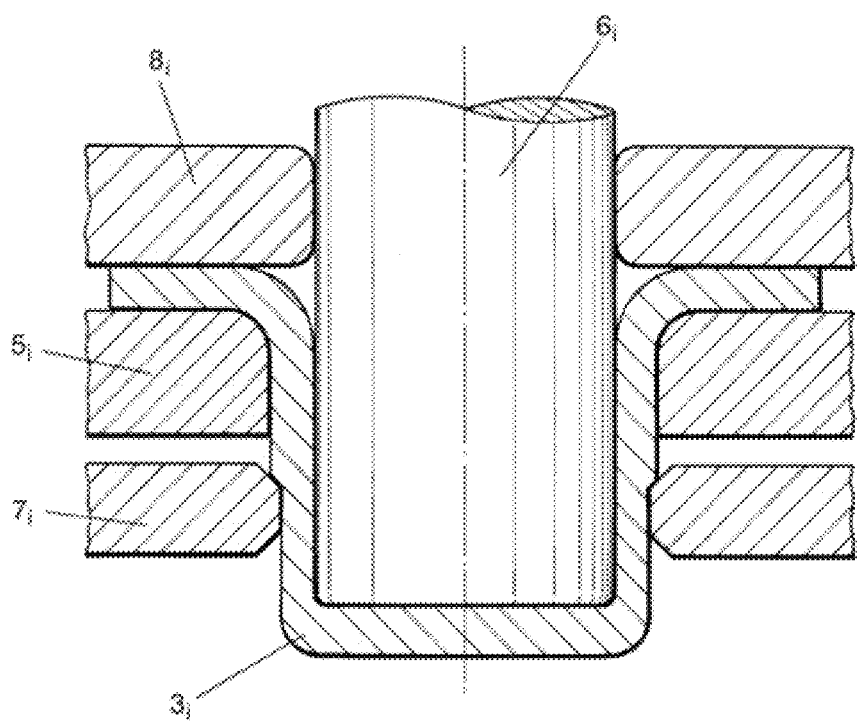
FIG. 3a depicts a step i of the sheet metal forming process where the operated elements and the intermediate metal part with a specific shape are observed.
Figure 3B:
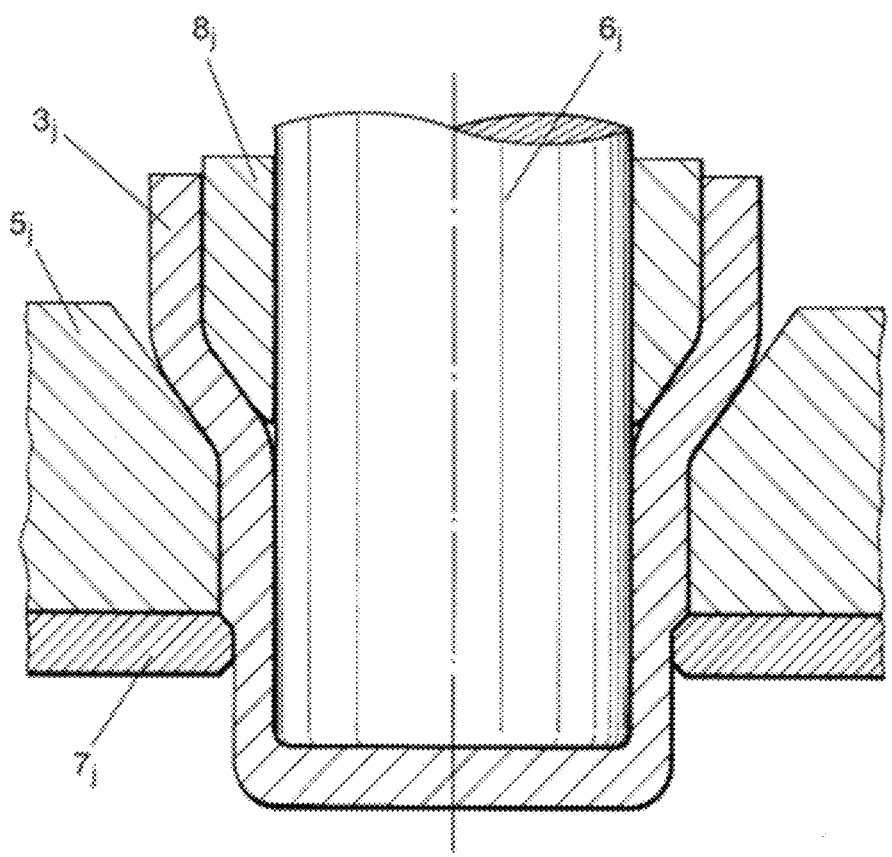
FIG. 3b depicts an intermediate step j of the forming process j>i for forming the part of FIG. 3a such that it is more formed.

The system, one of the embodiments of which is depicted in FIG. 2, comprises at least the following elements:
- a plurality of deep drawing dies ($5_1$-$5_n$) to perform deep drawing operations from sheet metal (1) simultaneously with ironing operations,
- a plurality of punches ($6_1$-$6_n$),
- a plurality of blank-holder elements ($8_1$-$8_n$) for holding or securing the part that is being deep drawn,
- centering and guiding elements for centering and guiding parts through the dies,
- a plurality of ironing dies ($7_1$-$7_n$) to perform ironing operations in each stage simultaneously with deep drawing operations, and
- at least some processing means (4) suitable for giving all the preceding elements full capability to carry out the process (deep drawing and drawing force, working speed, etc.).

Forming Process by Means of Simultaneous Deep Drawing and Ironing Operations

The process is characterized in that it comprises i stages (i=1 . . . n) in which the following successive steps are performed:
a) if i=1, providing the sheet metal (1),
b) if i≠1, providing an intermediate metal part ($3_{i-1}$),
c) providing working parameters to the processing means (4) of the elements that are involved, such as working pressure and approach, operating and recovery speeds of the punch ($6_i$),
d) performing a simultaneous deep drawing and ironing operation using the working parameters, making the deep drawing die ($5_i$), punch ($6_i$), ironing die ($7_i$) and blank-holder element ($8_i$) work simultaneously, obtaining an essentially cylindrical and essentially hollow intermediate metal part ($3_i$) as a result,
e) if i=n, repeating from step b) providing the essentially cylindrical and essentially hollow metal part ($3_i$) obtained in d) as the metal part, such that when i=n, the essentially cylindrical and essentially hollow final metal part (2) is obtained as a result.

FIG. 2 depicts a mass production line with the tool arranged in the mass production line so that one station is used in each step i to obtain an intermediate metal part (3). In the first step the sheet metal (1) is formed, and the final metal part (2) is obtained from the last step n. The processing means (4) are depicted in the figure as means suitable for accepting input data through a numerical keypad and display means, such as a screen for example.

In one embodiment of the invention, a drawing ratio of the first stage, $DR_1$, is applied $DR_1$, which allows the thickness of the bottom to remain unchanged, given that in one embodiment of the invention, the application is the manufacture of ammunition cartridge cases and it is fundamental for this thickness of the bottom to remain constant throughout the multistage process.

$$DR_i = \frac{\text{diameter resulting part stage } i-1}{\text{diameter part stage } i}$$

Usually for drawing ratios greater than 1.5, the material is drawn in the bottom region of the part, a phenomenon that should not occur in the embodiment of the invention.

Simulation of a Combined Process of Simultaneous Deep Drawing and Ironing Operations In one embodiment of the invention, the forming parameters, working parameters and number of stages n are predetermined by means of a simulation process that allows obtaining a first combined solution. The simulation process can be performed by processing means, for example a computer, or a microprocessor suitable for implementing the stages of the optimized simulation.

The combined simulation comprises two different parts: a simulation of deep drawing and ironing operations without simultaneously combining them and a combination of the stages for combining deep drawing and ironing operations simultaneously.

Simulation without Simultaneously Combining Deep Drawing and Ironing Operations

The simulation starts with the stages corresponding to the deep drawing operations:
providing design data about a simulated metal part (10) to be obtained, preferably the type of material to be used and the dimensions of the simulated metal part (10) to be obtained, such as the length of the final part, the thickness of the wall of the final part and the diameter of the final part,
calculating the dimensions of preferably disc-shaped simulated sheet metal (9) necessary for obtaining a simulated metal part (10) the characteristics of which coincide with those provided in the preceding step,
calculating the initial dimension of at least the following elements used in a first simulation,
a simulated punch,
simulated blank-holder,
a simulated deep drawing die and
a simulated ironing die,
performing in each step w, (w=1 . . . q)w, (w=1 . . . q):
a) if w=1, performing a simulation of the deep drawing of the simulated sheet metal (9) by means of a deep drawing simulation algorithm using the design parameters, obtaining an intermediate metal part ($11_1$) as a result,
b) if w≠1, performing a simulation of the deep drawing of the intermediate metal part ($11_{w-1}$) by means of a deep drawing simulation algorithm using the design parameters, obtaining another simulated intermediate metal part ($11_w$) as a result,
c) calculating and storing data about the simulation, preferably data about the resulting simulated intermediate metal part ($11_w$), such as the diameter, length and thickness of the wall, and the parameters of the participating elements, such as the dimensions of the simulated elements: a simulated punch, simulated blank-holder and a simulated deep drawing die, the approach, operating and recovery speeds of the punch in step w,
d) if the data about the resulting simulated intermediate metal part ($11_w$) does not coincide with the data about the simulated metal part (10) to be obtained, continuing in b) until reaching a step w=q for which a resulting simulated intermediate metal part ($11_w$) is obtained,
such that if the inner diameter of the simulated intermediate part ($11_w$) coincides with or is less than the inner diameter of the part to be obtained, this intermediate phase is adopted as the last phase of the multistage deep drawing process, and all the stored data about the intermediate metal parts ($11_1$-$11_n$) in each simulation step w,w=1 . . . q w,w=1 . . . q, as well as the parameters of the participating elements, such as the dimensions of the simulated elements: a simulated punch, simulated blankholder, a simulated deep drawing die and a simulated ironing die, the speed of the punch and the deep drawing die, the speed of the ironing die in each step w and the number q are provided as a result of the last iteration, n.

The deep drawing is simulated in a first instance. Providing the design data in the first stage is done by the user through data input means, for example a computer keyboard. The following data is used in a particular example: inner diameter of the simulated metal part (10) to be obtained, length, thickness of the bottom, thickness of the wall and type of material.

In the second stage, the calculation of the dimensions of the simulated sheet metal (9) necessary for obtaining a simulated metal part (10) is done by the processing means. This calculation is based on parameters such as the data entered by the user and characteristics of the selected material, such as physicochemical characteristics for example, specifically: density, tensile strength limit, yield strength limit, rigid-plastic behavior constant, strain hardening exponent and normal anisotropy value of the material. The dimensions of the starting sheet (9), which are the source for carrying out the deep drawing steps until achieving the final dimensions of the simulated metal part (10) to be obtained, are obtained considering the condition of incompressibility in the plastic deformation process and the condition of constant thickness of the bottom throughout the entire manufacturing process.

In the same manner, the initial dimension of elements used in a first simulation: the simulated punch, the simulated securing means, the simulated deep drawing die and the simulated ironing die, i.e., the dimension of the tool, is calculated by the processing means. The design of this punch is calculated as a function of the limiting drawing ratio and of the final dimensions of the simulated metal part (10) to be obtained. The initial solution is determined from the consideration of two limiting deep drawing conditions. The first limiting deep drawing condition is based on the fact that the maximum force exerted by the punch on the part during the deep drawing process must be less than the breaking load of the material. The second limiting deep drawing condition focuses on the limiting drawing ratio, and considering the condition of constant volume throughout the plastic deformation process, the limiting value of the drawing ratio is determined for the established conditions by the input data, the normal anisotropy coefficient of the material considered, the efficiency factor of the deep drawing process and the strain hardening coefficient.

A value of the diameter of the die, the thickness and the limiting drawing ratio are determined with the data about the dimensions obtained for the simulated punch. It is therefore possible to obtain a first diameter of the punch as a function of the diameter of the die and of the thickness of the disc of the part.

Once the dimensions of the simulated tool are calculated for the initial stage, w=1, an iterative simulation process of deep drawing actions starts, the number of stages of which will be such that, given the described characteristics of the selected material used, such as physicochemical characteristics for example, specifically: density, tensile strength limit, yield strength limit, rigid-plastic behavior constant, strain hardening exponent and normal anisotropy value of the material, a simulated final metal part (10) the inner diameter of which is the inner diameter of the simulated final metal part (10) to be obtained is achieved.

The simulation model provides the dimensions of the simulated tool for the initial stage, w=1, as input values of the simulation steps in which w≠1. The walls of the part remain considerably constant throughout the successive deep drawing steps, maintaining the original thickness of the bottom of same, which coincides with the starting disc. The purpose of the successive deep drawing steps is to obtain specific dimensions of the part such that it is prepared for the subsequent drawing process, i.e., to perform deep drawing steps until the inner diameter of the part (diameter of the punch) coincides with the inner diameter of the simulated final metal part (10) to be obtained. The initial solution for the deep drawing step w≠1 is established based on the consideration of three limiting deep drawing conditions. The variable considered for the calculation is, such as for w=1, the diameter of the die. The model selects the largest diameter from among the three diameters obtained in the three deep drawing conditions. Once the diameter is known, the model determines the remaining dimensions necessary for defining the part corresponding to this step. If the required inner dimension of the part is not achieved in w=1, the model performs as many successive deep drawing steps, w, as needed, i.e., an iterative process, until obtaining that step w=q in which the inner diameter coincides with or is less than the inner diameter of the final part to be obtained.

The first limiting redrawing condition is established with the requirement that the maximum deep drawing force exerted by the punch on the simulated intermediate part ($11_w$) during the deep drawing process must be less than the breaking load of the material. By means of an iterative process and considering the tensile strength limit of the material, the friction coefficient of the material and the angle of entry into the die, the desired diameter of the part is obtained from the diameter of the punch of the preceding step w−1 as a function of the thickness and of the diameter of the punch in this step w, and the process is performed iteratively, as many times needed, until obtaining the diameter of the punch corresponding to the last step of the deep drawing process w=q.

With respect to the second limiting deep drawing condition, said condition focuses on the rigid-plastic behavior of the material, therefore the outer diameter of the part of a generic stage 14; of the deep drawing process can be determined with respect to the diameter of the preceding stage w−1 and the final deformation.

Concerning the third limiting deep drawing condition, which focuses on the restriction of the limiting drawing ratio, the limiting drawing ratio is applied in the deep drawing operations, considering the effects of normal anisotropy of the material, the friction coefficient, the strain hardening coefficient and the radius of entry into the die. The limiting drawing ratio is used in this model as a variable to determine the necessary number of deep drawing steps w and the dimensions of the corresponding tools. It is assumed that the material is rigid-plastic. Given the consideration that the material is rotationally symmetrical, the properties of same are based on the existence of normal anisotropy and planar isotropy. It is considered that the stress created in the region of the radius of the redrawing die, which causes plastic instability in the wall of the cup, is equal to the radial deep drawing stress in the region of the flange, due to the continuity of the stress throughout the entire part.

It is therefore possible to determine the values of the limiting drawing ratio for each phase of the redrawing process starting from a given die radius and the reduction thereof in each deep drawing step w. Once the limiting drawing ratio corresponding to each deep drawing step w is known, the model determines the diameter of each step, giving a value to the diameter of the punch of a step w as a function of the ratio between the diameter of the preceding step w−1 and the limiting deep drawing limit.

The result of this iterative process is the provision of all the stored data about the intermediate metal parts ($11_1$-$11_q$) in each simulation step w,w=1 . . . q w,w=1 . . . q, as well as the parameters of the participating elements, such as the dimensions of the simulated elements: a simulated punch, simulated securing means, a simulated deep drawing die, the speed of the punch in each step w and the number q.

The simulation continues with the stages corresponding to the ironing operations as follows:

performing in each step j, (j=1 . . . m)j, (j=1 . . . m):

e) if j=1, performing a simulation of the ironing of the simulated previously deep drawn metal part (9) by means of a ironing simulation algorithm using the design parameters, obtaining a drawn intermediate metal part ($11_1$) as a result, f) if j≠1, performing a simulation of the ironing of the intermediate metal part ($11_{j-1}$) by means of a ironing simulation algorithm using the design parameters, obtaining another simulated intermediate metal part ($11_j$) as a result, g) calculating and storing data about the simulation, preferably data about the resulting simulated intermediate metal part ($11_j$), such as the diameter, length and thickness of the wall, and the parameters of the participating elements, such as the dimensions of the simulated elements: a simulated punch, simulated blank-holder, a simulated ironing die, the approach, operating and recovery speeds of the punch in step j, h) if the data about the resulting simulated intermediate metal part ($11_j$) does not coincide with the data about the simulated metal part (10) to be obtained, continuing in f) until reaching a step j=m for which a resulting simulated intermediate metal part ($11_j$) is obtained, such that if the thickness of the wall of the simulated intermediate part is equal to or less than the thickness of the final part to be obtained, this intermediate phase is adopted as the final phase, the thickness of the final part being the thickness corresponding to that of the last stage, and all the stored data about the intermediate metal parts ($11_1$-$11_m$) in each simulation step j,j=1 . . . m, as well as the parameters of the participating elements, such as the dimensions of the simulated elements: a simulated punch, simulated blank-holder, a simulated deep drawing die and a simulated ironing die, the speed of the punch and the deep drawing die, the speed of the ironing die in each step j and the number m are provided as a result of the last iteration, m.

Ironing operations are simulated in this second instance, i.e., the thickness of the wall is progressively reduced until achieving the thickness of the final part. New conditions for obtaining diameters are established. The number of steps needed will depend on the dimensions of the simulated final metal part (10) to be obtained. The considered model is based on complying with three limiting ironing conditions in each of the ironing steps, and starting from the data about the deep drawing process. The diameter of the intermediate metal parts ($11_1$-$11_m$) is determined for each limiting ironing condition, and the largest diameter of the three is chosen because the model requires complying with the three limiting conditions. If the chosen diameter is greater than the final diameter of the part produced by the deep drawing process, the model stores the data obtained as data corresponding to an intermediate step j and again repeats the process. The process is recurrent until the final thickness of the part to be obtained is achieved.

The first limiting ironing condition is determined by the fact that the mean ironing stress must be less than the breaking stress of the material. This first limiting drawing condition provides the diameter as a function of: the tensile strength limit of the material, an ironing coefficient depending on the material, the diameter of the part in the preceding stage j−1 and the ironing force in said stage j−1.

Concerning the second limiting ironing condition, it is expressed as the stress exerted in the material ironing process being less than the yield limit. Starting from annealed material and using an efficiency factor, the expression corresponding to the second limiting ironing condition is determined, and the diameter is determined as a function of the diameter of the preceding stage j−1 and the increase in deformation.

The third limiting ironing condition, relating to the limiting thickness reduction coefficient, must be complied with. This coefficient starts from empirical considerations. A coefficient is considered in the simulation method for each deep drawing step w that fundamentally depends on the drawing step j and on the type of material used.

Combination of the Simulation for Simultaneously Combining Deep Drawing and Ironing Operations After the simulation of the deep drawing and ironing operations separately, a combination of the number of deep drawing and ironing stages is performed such that the combined number n depending on q and m is obtained.

Therefore, the forming parameters, working parameters and number of stages, after having been predetermined by means of the non-combined simulation process, are combined by means of a process that combines the number of deep drawing and ironing stages such that the combined number n depending on q and m is obtained, whereby it is possible to perform deep drawing and ironing simultaneously in successive iterative steps instead of implementing them consecutively.

Five deep drawing steps and 2 ironing steps have been determined in one embodiment. By applying the combination, both processes are combined to perform only 5 steps instead of 7 steps (5+2).

Optimized Simulation by Simultaneously Combining Deep Drawing and Ironing Operations In one embodiment, the process optimizing the number of deep drawing and ironing stages such that the optimal number n is obtained is described below. The simulation combines deep drawing operations with ironing operations, such that the total number of stages is reduced, and the manufacturing time, process cost, overall work performed and energy consumption are also reduced. The optimal number n depending on q and m is thus obtained and comprises the steps of:

Combined Simulation
providing the data about the intermediate metal parts ($11_w, 11_j$) provided by the simulation without simultaneously combining deep drawing and ironing operations in each simulation step, as well as the parameters of the participating elements, such as the dimensions of the simulated elements: a simulated punch, simulated blank-holder, a simulated deep drawing die and a simulated ironing die, the approach speed of the punch, the operating speed of the punch and the recovery speed of the punch in each step, and the numbers q,m,
if q<m (deep drawing steps<ironing steps), n=m is used and the combined process follows the following steps:
  i. the diameter of step w=1 is used as the diameter of the first step i=1,
  j. the thicknesses calculated in the non-combined solution of ironing stages j=1 to j=n−1 are used as the thicknesses of the wall of stages i=1 to i=n−1,
  k. the final diameter to be obtained is used as the final diameter of the stage i=n,
  l. the thickness of the final part to be obtained is used as the thickness of the wall of the stage i=n,
  m. the thickness of the final part to be obtained is used as the thickness of the bottom of the n combined stages, and it remains unchanged throughout the entire combined process,
  n. the mouth thickness reduction ratios, $$K_i = \frac{\text{thickness stage } i-1}{\text{thickness stage } i} K_i = \frac{espesoretapai - 1}{espesoretapai},$$

obtained in ironing stages j=1 to j=n are used,
  o. the drawing ratio obtained in the first simulation stage of the deep drawing operations, w=1, is used as the drawing ratio of the first stage $DR_i$,
  p. the drawing ratios $DR_i$ and the diameters of the intermediate stages of the combined process are obtained by means of calculating the parameters: diameter, thickness and length of the intermediate stages completing the resolution of the process, $d_i, s_i, l_i$ iteratively obtaining $d_i, s_i$ using the mentioned parameters and $l_i$ as follows:

$$l_{i-1} = \frac{\frac{K}{\pi} - \frac{d_{i-1}^2 s_n}{4} - s_{i-1}^2 s_n + d_{i-1} s_{i-1} s_n}{s_{i-1}(d_{i-1} - s_{i-1})}$$

$$l_i = \frac{\frac{K}{\pi} - \frac{d_i^2 s_n}{4} - s_i^2 s_n + d_i s_i s_n}{s_i(d_i - s_i)}$$

$$l_{e,i} = \frac{\frac{K}{\pi} - \frac{d_{e,i}^2 s_n}{4} - s_{i-1}^2 s_n + d_{e,i} s_{i-1} s_n}{s_{i-1}(d_{e,i} - s_{i-1})}$$

if q>m q>m (deep drawing steps>ironing steps), n=q, the combined process is defined as follows:
  q. the diameters obtained in the simulation of the deep drawing stages w=1 to w=n−1 are used as the initial diameters of the combined solution of the different stages,
  r. the final diameter to be obtained is used as the final diameter of the stage i=n,
  s. the thickness of the final part to be obtained is used as the thickness of the wall of the stage i=n,
  t. the thickness of the final part to be obtained is used as the thickness of the bottom of the n combined stages, and it remains unchanged throughout the entire combined process,
  u. the drawing ratios obtained in deep drawing stages w=1 to w=n are used as the drawing ratios $DR_i$,
  v. the ironing ratios $K_i$ and the diameters of the intermediate stages of the combined process are obtained by means of calculating the parameters: diameter, thickness and length of the intermediate stages completing the resolution of the process, $d_i, s_i, l_i$, iteratively obtaining $d_i, s_i$ using the mentioned parameters and $l_i$ as follows:

$$l_{i-1} = \frac{\frac{K}{\pi} - \frac{d_{i-1}^2 s_n}{4} s_{i-1}^2 s_n + d_{i-1} s_{i-1} s_n}{s_{i-1}(d_{i-1} - s_{i-1})}$$

$$l_i = \frac{\frac{K}{\pi} - \frac{d_i^2 s_n}{4} - s_i^2 s_n + d_i s_i s_n}{s_i(d_i - s_i)}$$

-continued $$l_{e,i} = \frac{\frac{K}{\pi} - \frac{d_{e,i}^2 s_n}{4} - s_{i-1}^2 s_n + d_{e,i} s_{i-1} s_n}{s_{i-1}(d_{e,i} - s_{i-1})}$$

As the number of stages advances from the initial stage, the selected drawing ratios are taken and the parameters of the subsequent stage are calculated. Therefore, if the drawing ratio in stage 2, for example, is $DR_2=2$ and the diameter in stage $i-1=1$ is 3 mm, such as $$DR_i = \frac{\text{diameter resulting part stage } i-1}{\text{diameter part stage } i}$$

then, diameter part stage 2 =

$$\frac{\text{diameter resulting part stage } 1}{DR_2} = \frac{3}{2} = 1.5 \text{ mm}.$$

The following parameters are thus solved:
$d_i$=outer diameter of the resulting part in simulation step
$s_i$=thickness of the wall of the resulting part in simulation step i,
$l_i$=length of the part in simulation step i.

Optimization of the Combined Simulation

The parameters obtained by means of the combined simulation process are optimized by means of a combination optimization algorithm. This algorithm is based on the resolution of a target function.

The target function minimizes the overall work performed in the optimized combined process, this function being:

$$f_w = \sum_{i=1}^{n} [\text{blankholder work} + \text{deep drawing work} + \text{ironing work}] =$$

$$\sum_{i=1}^{n} \left[ -0.015 S_y \pi (d_{i-1} - 2s_{i-1}) h \cos(\alpha) l_{i-1} + \left[ \pi(d_i - 2s_i) s_{i-1} S_u \frac{d_{i-1}}{d_{e,i}} - 0.7 \right] l_{e,i} + \frac{\pi}{4} (d_{e,i}^2 - d_1^2) n_e S_u l_i \right]$$

with
S=yield strength limit of the material used for the simulation,
h=height of the holding or securing element
$S_u$=tensile strength limit of the material used for the simulation,
α=angle of entry into the deep drawing die,
$n_e$=ironing coefficient=$s_n/s_1$,
$d_{i-1}d_{i-1}$ outer diameter of the resulting part in simulation step i-1,
$s_{i-1}$=thickness of the wall of the resulting part in simulation step i-1,
$l_{i-1}l_{i-1}$ length of the part in simulation step i-1
$d_{e,i}$ intermediate diameter in simulation step i,
$d_{e,i}=d_i+2(s_{i-}-s_i)$,
where the parameters that are minimized are:
$d_i$=outer diameter of the resulting part in simulation step i,
$s_i$=thickness of the wall of the resulting part in simulation step i,
$l_i$=length of the part in simulation step i, In one embodiment of the invention, the following restrictions are assumed in the optimization process:

$V_i=V_{i-1}=K$,
with $$V_i = \text{total part volume} = \frac{\pi}{4} d_i^2 l_i + \frac{\pi}{4} (d_i - 2s_i)^2 (l_i - s_n)$$

$d_{i-1}-s_{i-1} \leq 1.7 d_i - 3.4 s_i$,
$n_e(d_i s_{i-1} - d_i s_i + s_{i-1}^2 s_i + s_i^2) < d_i s_i - s_i^2$.

such that the parameters minimizing the target function and defining the optimized combined process in their entirety are obtained as a result.

Finding the parameters minimizing the function of the overall work also indirectly reduces the overall time used and the manufacturing cost, defined as:
the overall time invested in the simulation process:

$$f_t = \sum_{i=1}^{n} t_i$$

with $l_i$ being the time used in each simulation step i for simulating the deep drawing and the ironing, $$t_i = \frac{l_{i-1}}{v_{a,i}} + \frac{L_{u,i} + l_i}{v_{e,i}} + \frac{l_{i-1} + L_{u,i} + l_i}{v_{s,i}}$$

$v_{a,i}$=approach speed of the punch in simulation step i,
$v_{e,i}$=operating speed of the punch in simulation step i,
$v_{s,i}$=recovery speed of the punch in simulation step i,
$L_{u,i}$=length of the tool assembly in simulation step i,
and the total process cost:

$$f_c = C_{mf} + C_E = \sum_{i=1}^{n} \left( c_{lb} t_i + \frac{c_e}{3.6 * 10^6} W_i \right)$$

$C_{mf}$=cost of the work applied to the simulated sheet metal (9),
$C_E$=cost of the electricity used to operate the machines used in the deep drawing and the drawing,
$c_{lb}$ hourly labor cost,
$c_e$=energy cost per hour,
Wi=overall work in simulation step i.

Experimental Example of the Application of the Optimized Combined Solution

In one embodiment, the sheet metal forming method is implemented by previously carrying out the simulation and optimization processes. The manufacture of an ammunition cartridge case manufactured in UNS C26000 brass has been simulated in the complete example. Table 1 shows the final dimensions of the part to be obtained as well as the characteristics of the material used in the experiment. The friction coefficients that were used are also included.

TABLE 1

Final dimensions and material of the experiment

| | |
|---|---|
| Outer diameter ($d_n$) | 110.6 mm |
| Length ($l_n$) | 560 mm |
| Thickness of the bottom ($s_n$) | 7.3 mm |
| Thickness of the wall ($e_n$) | 1.2 mm |

TABLE 1-continued

Final dimensions and material of the experiment

| | |
|---|---|
| Material | UNS C26000 |
| Density, $\rho$ | 8.53 Kg/dm$^3$ |
| Rigid-plastic behavior constant of the material, C | 895.0 MPa |
| Strain hardening exponent of the material, n | 0.485 |
| Yield strength limit, $S_y$ | 435.0 MPa |
| Tensile strength limit, $S_u$ | 525.0 MPa |
| Normal anisotropy coefficient, R | 0.83 |
| Friction coefficient, disc-die | 0.1 |
| Friction coefficient, disc-punch | 0.12 |
| Friction coefficient, part-die | 0.1 |
| Friction coefficient, part-punch | 0.12 |

The system consists of three parts: tool, hydraulic system and control panel. The tool is formed by a support housing the dies and the blank-holder elements. The punch is integral with the movable head of the press. Machinery operation as well as the pressure regulation, speed regulation and pressure recordings taken along the path of the punch are performed by means of the control panel.

Figure 4A:
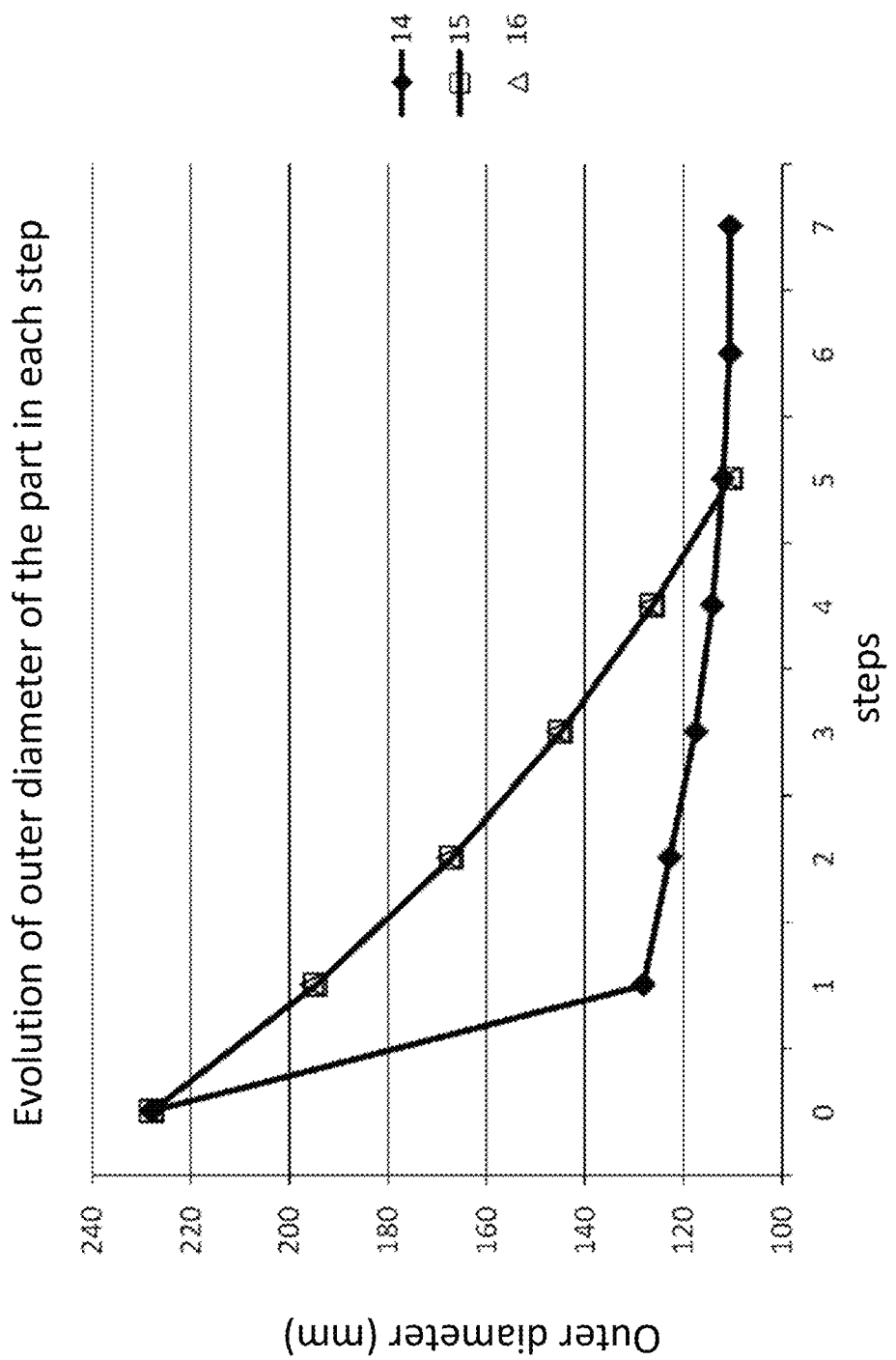
FIG. 4a shows the evolution of the outer diameter of the part that is obtained in each step in millimeters in an experimental example.

As indicated in the graphs in FIGS. 4A, 4B and 4C, the combined deep drawing and ironing process allows reducing the overall process from seven to five steps. The drawings show the evolution of the more important dimensions of the steps: FIG. 4A shows the evolution of the outer diameter of the part that is obtained in each step in millimeters, FIG. 4B shows the evolution of the thickness of the wall of the part that is obtained in each step in millimeters, and FIG. 4C shows the evolution of the total length of the part that is obtained in each step in millimeters. It can be seen in the three figures that the new the designed process (15) shows a process that is much more compensated than the conventional process (14). The experimental results (16) comply with the theoretical design (15).

The results depicted in the graphs in FIGS. 4A, 4B and 4C are observed in Table 2.

TABLE 2

Evolution of the diameter of the part obtained in each step of the process
EVOLUTION OF THE DIAMETER IN mm

| step | 0 | 1 | 2 | 3 | 4 | 5 | 6 | 7 |
|---|---|---|---|---|---|---|---|---|
| non-combined solution (14) | 228 | 128.18 | 122.8 | 117.6 | 114.21 | 112.02 | 110.62 | 110.6 |
| optimized combined solution (15) | 228 | 194.8 | 167.2 | 144.9 | 126.3 | 110.6 | | |
| experimental result (16) | 228 | 195.5 | 167.7 | 145.5 | 126.7 | 110.8 | | |

TABLE 3

Evolution of the thickness of the wall of the part obtained in each step of the process
EVOLUTION OF THE THICKNESS OF THE WALL IN mm

| step | 0 | 1 | 2 | 3 | 4 | 5 | 6 | 7 |
|---|---|---|---|---|---|---|---|---|
| non-combined solution (14) | 7.3 | 7.3 | 7.3 | 4.7 | 3.01 | 1.91 | 1.21 | 1.2 |
| optimized combined solution (15) | 7.3 | 5.16 | 3.4 | 2.3 | 1.6 | 1.2 | | |
| experimental result (16) | 7.3 | 5.35 | 3.35 | 2.1 | 1.52 | 1.15 | | |

TABLE 4

Evolution of the length of the part obtained in each step of the process
EVOLUTION OF THE LENGTH IN mm

| step | 0 | 1 | 2 | 3 | 4 | 5 | 6 | 7 |
|---|---|---|---|---|---|---|---|---|
| non-combined solution (14) | 0 | 84.3 | 87.2 | 138.5 | 219.9 | 349.3 | 554.8 | 560 |
| optimized combined solution (15) | 0 | 33.5 | 86.1 | 179.5 | 336 | 560 | | |
| experimental result (16) | 0 | 33.7 | 91.7 | 205.6 | 372 | 610 | | |

Figure 5:
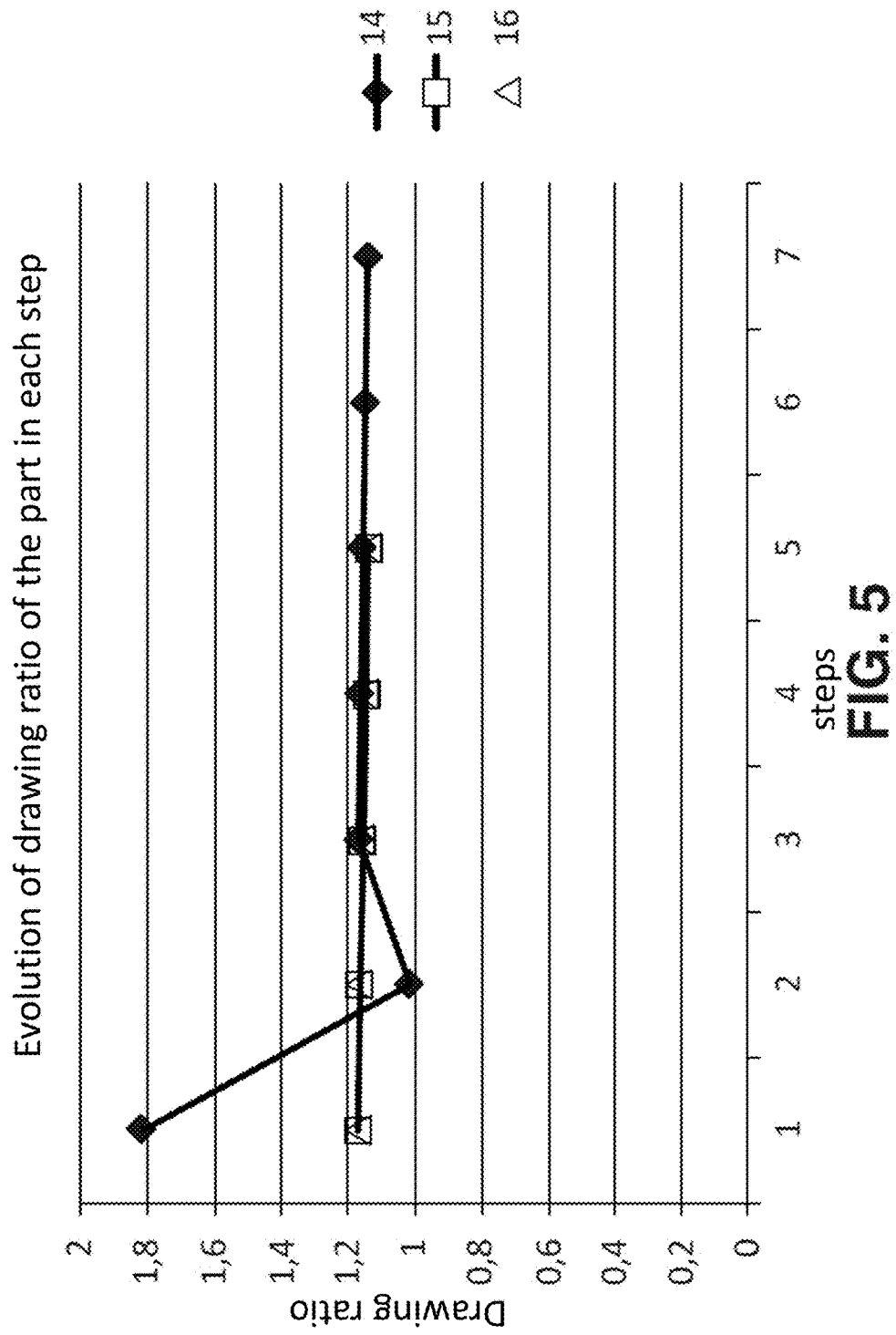
FIG. 5 depicts the evolution of the drawing ratio in each step of the process.

Furthermore, as shown in FIG. 5, the drawing ratio (DR) has similar values for the five stages designed, which shows a much more balanced process compared with the initial solution. The highest drawing ratios (DR) obtained in the first phases of the initial design (14) are reduced in the combined process (15).

TABLE 5

Evolution of the drawing ratio (DR) in each step of the process
EVOLUTION OF THE DRAWING RATIO IN EACH STEP

| step | 1 | 2 | 3 | 4 | 5 | 6 | 7 |
|---|---|---|---|---|---|---|---|
| non-combined solution (14) | 1.8215 | 1.0194 | 1.1706 | 1.1651 | 1.1539 | 1.1471 | 1.1418 |
| optimized combined solution (15) | 1.1706 | 1.1651 | 1.1539 | 1.1471 | 1.1418 | | |
| experimental result (16) | 1.1662 | 1.1658 | 1.1526 | 1.1484 | 1.1435 | | |

Concerning the overall process time, a shorter overall time for the combined process with respect to the conventional process is also achieved, these values being:
Conventional process time: 35.45 seconds,
Estimated time in the simulation of the combined process: 26.21 seconds,
Time used in the experiment: 27.53 seconds.
These times are obtained with the aforementioned ratio:

$$f_t = \sum_{i=1}^{n} t_i$$

where $t_i = \frac{l_{i-1}}{v_{a,i}} + \frac{L_{u,i} + l_i}{v_{e,i}} + \frac{l_{i-1} + L_{u,i} + l_i}{v_{s,i}}$.

According to the results obtained, a 26% improvement of the combined process is achieved with respect to the initial solution. With respect to the experimental result, there is a 22.34% improvement, so a 95.2% validation degree is obtained for the model with respect to the experimental solution.

Concerning the overall work used in the process, the following values are achieved:
conventional work process: 648.9 KJ
estimated work in the simulation of the combined process: 543.55 KJ),
work used in the experiment: 566.99 KJ.
The overall work performed is obtained with the aforementioned ratio:

$$f_w = \sum_{i=1}^{n} [\text{blankholder work} + \text{deep drawing work} + \text{ironing work}] =$$

$$\sum_{i=1}^{n} \left[ -0.015 S_y \pi (d_{i-1} - 2s_{i-1}) h \cos(\alpha) l_{i-1} + \left[ \pi (d_i - 2s_i) s_{i-1} S_u \frac{d_{i-1}}{d_{e,i}} - 0.7 \right] l_{e,i} + \frac{\pi}{4} (d_{e,i}^2 - d_1^2) n_e S_u l_i \right]$$

According to the obtained results, a 16.23% improvement in the work performed through the optimized combined process is achieved with respect to the non-combined solution. Comparatively speaking, between the non-combined solution and the experimental result there is a 12.62% improvement. These results show a 95.86% validation of the experimental result with respect to the solution of the optimized combined simulation process that has been designed.

Figure 6:
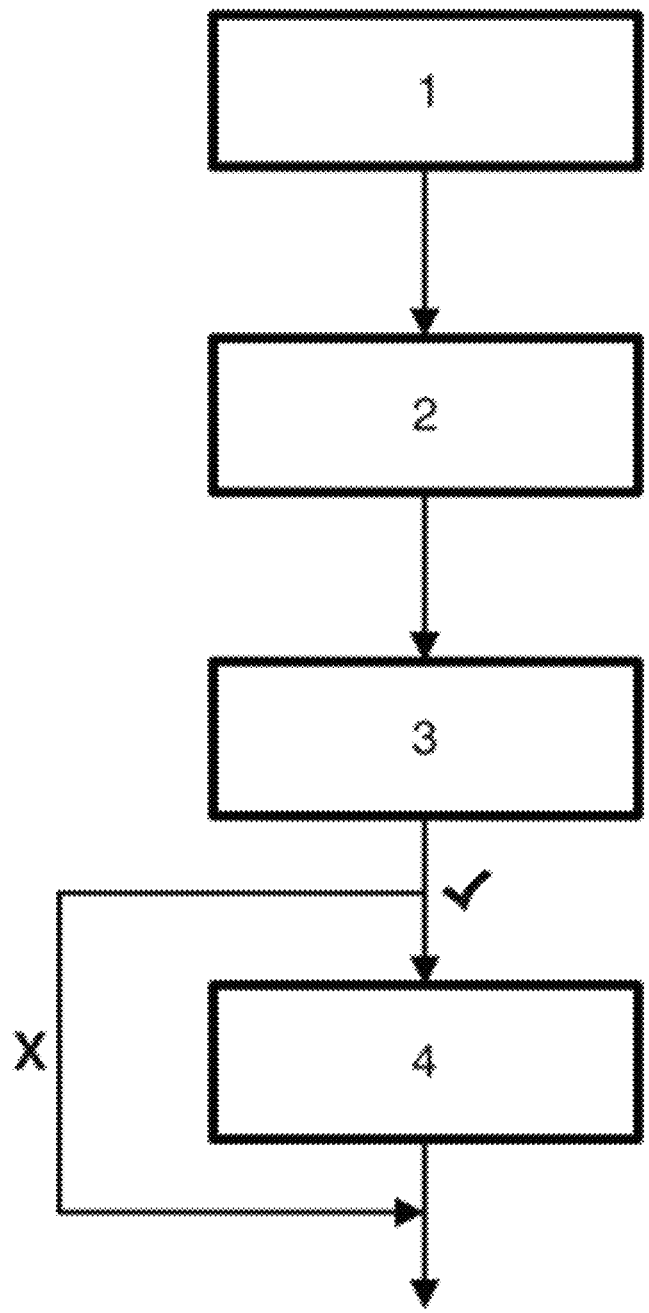
FIG. 6 depicts a flow of actions performed in an optimized combined simulation process.

FIG. 6 depicts a flowchart of all the operations carried out in an embodiment of an optimized combined simulation process:

1. Simulation without simultaneously combining deep drawing and ironing stages: Simulation stage of the deep drawing steps.
2. Simulation without simultaneously combining deep drawing and ironing stages: Simulation stage of the ironing steps.
3. Combined simulation. This stage seeks a number of stages that combine simultaneous deep drawing and ironing operations, even though they may not be optimal.
4. Optimized combined simulation. In this stage, the dimensions of the tools and elements are calculated such that the overall work performed is reduced, as indicated in the example.

The optimization stage is optional and can be applied in the event of needing a combined process the parameters of which must be optimized to reduce the overall work performed.

The invention claimed is:

1. A sheet metal (1) forming process for obtaining an essentially cylindrical and essentially hollow final metal part (2) in a system comprising at least the following elements:
    a plurality of deep drawing dies ($5_1$-$5_n$) to perform deep drawing operations from sheet metal (1) simultaneously with ironing operations,
    a plurality of punches ($6_1$-$6_n$),
    a plurality of blank-holder elements ($8_1$-$8_n$) for holding or securing a part that is being deep drawn,
    centering and guiding elements for centering and guiding parts through the dies,
    a plurality of ironing dies ($7_1$-$7_n$) to perform ironing operations in each stage simultaneously with deep drawing operations, and
    at least some processing means (4) suitable for giving the plurality of deep drawing dies, the plurality of punches, the plurality of blank-holder elements, the centering and guiding elements, and the plurality of ironing dies full capability to carry out the process, wherein the full capability includes deep drawing and ironing force and working speed,
    the process being characterized in that it comprises i stages (i=1 . . . n) wherein the following steps are performed:
    a) if i=1, providing a sheet metal (1),
    b) if i≠1, providing an intermediate metal part ($3_{i-1}$),
    c) providing working parameters to the processing means (4) of the elements that are involved, such as operating speed of the punch ($6_i$) and speed at which the part is ironed, pushed by the punch, as it passes through the ironing die ($7_i$),
    d) performing a simultaneous deep drawing and ironing operation using the working parameters, making the deep drawing die ($5_i$), punch ($6_i$), ironing die ($7_i$) and blank-holder elements ($8_i$) work simultaneously, obtaining an essentially cylindrical and essentially hollow intermediate metal part ($3_i$) as a result,
e) if i≠n, repeating from step b) providing the essentially cylindrical and essentially hollow metal part ($3_i$) obtained in d) as the metal part,
such that when i=n, the essentially cylindrical and essentially hollow final metal part (2) is obtained as a result, and
where forming parameters, working parameters and number of stages n are predetermined by means of an optimization process comprising the stages of:
   providing design data about a simulated metal part (10) to be obtained, wherein the design data is the type of material to be used and dimensions of the simulated metal part (10) to be obtained, such as the length of the final part, the thickness of the wall of the final part and the diameter of the final part,
   calculating the dimensions of disc-shaped simulated sheet metal (9) necessary for obtaining a simulated metal part (10) the characteristics of which coincide with those provided in the preceding step,
   calculating an initial dimension of at least the following elements used in a first simulation,
   a simulated punch,
   simulated blank-holder,
   a simulated deep drawing die and
   a simulated ironing die,
   performing in each step w, (w=1 ... q):
     a) if w=1, performing a simulation of the deep drawing of the simulated sheet metal (9) by means of a deep drawing simulation algorithm using the design parameters, obtaining an intermediate metal part ($11_1$) as a result,
     b) if w≠1, performing a simulation of the deep drawing of the intermediate metal part ($11_{w-1}$) by means of a deep drawing simulation algorithm using the design parameters, obtaining another simulated intermediate metal part ($11_w$) as a result,
     c) calculating and storing data about the simulation, wherein the data is data about the resulting simulated intermediate metal part ($11_w$), such as the diameter, length and thickness of the wall, and the parameters of the participating elements, such as the dimensions of the simulated elements: a simulated punch, simulated blank-holder and a simulated deep drawing die, the approach, operating and recovery speeds of the punch in step w,
     d) if the data about the resulting simulated intermediate metal part ($11_w$) does not coincide with the data about the simulated metal part (10) to be obtained, continuing in b) until reaching a step w=q for which a resulting simulated intermediate metal part ($11_w$) is obtained,
   such that if the inner diameter of the simulated intermediate part ($11_w$) coincides with or is less than the inner diameter of the part to be obtained, an intermediate stage is adopted as a last stage of a multistage deep drawing process, and all the stored data about the intermediate metal parts ($11_1$-$11_q$) in each simulation step w, w=1 ... q, as well as the parameters of the participating elements, such as the dimensions of the simulated elements: a simulated punch, simulated blank-holder, a simulated deep drawing die and a simulated ironing die, the speed of the punch and the deep drawing die, the speed at which the part is ironed, pushed by the punch, as it passes through the ironing die in each step w and the number q are provided as a result of the last iteration, n,
   performing in each step j, (j=1 ... m):
     e) if j=1, performing a simulation of the ironing process of the simulated previously deep drawn metal part (9) by means of a ironing simulation algorithm using the design parameters, obtaining a drawn intermediate metal part ($11_1$) as a result,
     f) if j≠1, performing a simulation of the ironing process of the intermediate metal part ($11_{j-1}$) by means of a ironing simulation algorithm using the design parameters, obtaining another simulated intermediate metal part ($11_j$) as a result,
     g) calculating and storing data about the simulation, wherein the data is data about the resulting simulated intermediate metal part ($11_j$), such as the diameter, length and thickness of the wall, and the parameters of the participating elements, such as the dimensions of the simulated elements: a simulated punch, simulated blank-holder, a simulated ironing die, the approach, operating and recovery speeds of the punch in step j,
     h) if the data about the resulting simulated intermediate metal part ($11_j$) does not coincide with the data about the simulated metal part (10) to be obtained, continuing in f) until reaching a step j=m for which a resulting simulated intermediate metal part ($11_j$) is obtained,
   such that if the thickness of the wall of the simulated intermediate part is equal to or less than the thickness of the final part to be obtained, this intermediate stage is adopted as the last stage, the thickness of the final part being the thickness corresponding to that of the last stage, and all the stored data about the intermediate metal parts ($11_1$-$11_m$) in each simulation step j, j=1 ... m, as well as the parameters of the participating elements, such as the dimensions of the simulated elements: a simulated punch, simulated blank-holder, a simulated deep drawing die and a simulated ironing die, the speed of the punch and the deep drawing die, the speed at which the part is ironed, pushed by the punch, as it passes through the ironing die in each step j and the number m are provided as a result of the last iteration, m,
   combining the number of deep drawing and ironing stages by means of an optimization algorithm such that the combined number n depending on q and m is obtained.

2. The sheet metal (1) forming process according to claim 1, characterized in that the parameters are optimized by means of an optimization method comprising the stages of:
   providing the data about the intermediate metal parts ($11_w$,$11_j$) provided by the simulation without simultaneously combining deep drawing and ironing operations in each simulation step, as well as the parameters of the participating elements, such as the dimensions of the simulated elements: a simulated punch, simulated blankholder, a simulated deep drawing die and a simulated ironing die, the approach speed of the punch, the operating speed of the punch and the recovery speed of the punch in each step, and the numbers q, m,
   if q<m (deep drawing steps<drawing steps), n=m becomes true and the combined process follows the following steps:
     i. the diameter of step w=1 is used as the diameter of the first step i=1,
     j. the thicknesses calculated in the non-combined solution of drawing stages j=1 to j=n−1 are used as the thicknesses of the wall of stages i=1 to i=n−1, k. the final diameter to be obtained is used as the final diameter of the stage i=n,
l. the thickness of the final part to be obtained is used as the thickness of the wall of the stage i=n,
m. the thickness of the final part to be obtained is used as the thickness of the bottom of the n combined stages and it remains unchanged throughout the entire combined process,
n. the mouth thickness reduction ratios, $$K_i = \frac{\text{thickness stage } i-1}{\text{thickness stage } i},$$

obtained in drawing stages j=1 to j=n are used,
o. the drawing ratio obtained in the first simulation stage of the deep drawing operations, w=1, is used as the drawing ratio of the first stage $DR_i$, where $$DR_i = \frac{\text{diameter resulting part stage } i-1}{\text{diameter part stage } i},$$

p. the drawing ratios $DR_i$ and the diameters of the intermediate stages of the combined process are obtained by means of calculating the parameters: diameter, thickness and length of the intermediate stages completing the resolution of the process, $d_i, s_i, l_i$, iteratively obtaining $d_i, s_i$ by using the mentioned parameters being, and $l_i$ as follows:

$$l_{i-1} = \frac{\frac{K}{\pi} - \frac{d_{i-1}^2 s_n}{4} s_{i-1}^2 s_n + d_{i-1} s_{i-1} s_n}{s_{i-1}(d_{i-1} - s_{i-1})}$$

$$l_i = \frac{\frac{K}{\pi} - \frac{d_i^2 s_n}{4} - s_i^2 s_n + d_i s_i s_n}{s_i(d_i - s_i)}$$

$$l_{e,i} = \frac{\frac{K}{\pi} - \frac{d_{e,i}^2 s_n}{4} - s_{i-1}^2 s_n + d_{e,i} s_{i-1} s_n}{s_{i-1}(d_{e,i} - s_{i-1})}$$

if q>m (deep drawing steps>ironing steps), n=q becomes true and the combined process is defined as follows:
q. the diameters obtained in the simulation of the deep drawing stages w=1 to w=n−1 are used as the initial diameters of the combined solution of the different stages,
r. the final diameter to be obtained is used as the final diameter of the stage i=n,
s. the thickness of the final part to be obtained is used as the thickness of the wall of the stage i=n,
t. the thickness of the final part to be obtained is used as the thickness of the bottom of the n combined stages, and it remains unchanged throughout the entire combined process,
u. the drawing ratios obtained in deep drawing stages w=1 to w=n are used as the drawing ratios $DR_i$,
v. the ironing ratios $K_i$ and the diameters of the intermediate stages of the combined process are obtained by means of calculating the parameters: diameter, thickness and length of the intermediate stages completing the resolution of the process, $d_i, s_i, l_i$, iteratively obtaining $d_i, s_i$ by using the mentioned parameters and $l_i$ as follows:

$$l_{i-1} = \frac{\frac{K}{\pi} - \frac{d_{i-1}^2 s_n}{4} s_{i-1}^2 s_n + d_{i-1} s_{i-1} s_n}{s_{i-1}(d_{i-1} - s_{i-1})}$$

$$l_i = \frac{\frac{K}{\pi} - \frac{d_i^2 s_n}{4} - s_i^2 s_n + d_i s_i s_n}{s_i(d_i - s_i)}$$

$$l_{e,i} = \frac{\frac{K}{\pi} - \frac{d_{e,i}^2 s_n}{4} - s_{i-1}^2 s_n + d_{e,i} s_{i-1} s_n}{s_{i-1}(d_{e,i} - s_{i-1})}$$

solving the target function minimizing the overall work performed in the optimized combined process, this function being:

$$f_w = \sum_{i=1}^{n} [\text{blankholder work} + \text{deep drawing work} + \text{ironing work}] =$$

$$\sum_{i=1}^{n} \left[ -0.015 S_y \pi (d_{i-1} - 2s_{i-1}) h \cos(\alpha) l_{i-1} + \left[ \pi(d_i - 2s_i) s_{i-1} S_u \frac{d_{i-1}}{d_{e,i}} - 0.7 \right] l_{e,i} + \frac{\pi}{4} (d_{e,i}^2 - d_1^2) n_e S_u l_i \right]$$

with
$S_y$=yield strength limit of the material used for the simulation,
h=height of the blank-holder
$S_u$=tensile strength limit of the material used for the simulation,
α=angle of entry into the deep drawing die,
$n_e$=ironing coefficient=$s_n/s_1$,
$d_{i-1}$=outer diameter of the resulting part in simulation step i−1,
$s_{i-1}$=thickness of the wall of the resulting part in simulation step i−1,
$l_{i-1}$=length of the part in simulation step i−1,
$d_{e,i}$=intermediate diameter in simulation step i, $$d_{e,i} = d_i + 2(s_{i-1} - s_i),$$

where the parameters that are minimized are:
$d_i$=outer diameter of the resulting part in simulation step i,
$s_i$=thickness of the wall of the resulting part in simulation step i,
$l_i$=length of the part in simulation step i,
such that the parameters minimizing the functions are obtained as a result.

3. The sheet metal (1) forming process according to claim 2, wherein the following restrictions are assumed in the optimization process:
$V_i = V_{i-1} = K$,
with $$V_i = \text{total part volume} = \frac{\pi}{4} d_i^2 l_i + \frac{\pi}{4}(d_i - 2s_i)^2 (l_i - s_n)$$

$d_{i-1} - s_{i-1} \leq 1.7 d_i - 3.4 s_i$,
$n_e(d_i s_{i-1} - d_i s_i + s_{i-1}^2 - 2s_{i-1} s_i + s_i^2) < d_i s_i - s_i^2$.
where $n_e$ is the ironing coefficient such that the parameters minimizing the target function and defining the optimized combined process in their entirety are obtained as a result.

4. The forming process according to claim 1, characterized in that the forming parameters characterizing an essentially cylindrical simulated intermediate metal part ($11_i$) to be obtained in each stage i are:

outer diameter of the metal part, $d_i$,
length of the metal part, $l_i$,
thickness of the bottom of the metal part, $e_i$,
thickness of the wall of the metal part, $s_i$,
type of metal to be used,
yield strength limit of the material used for the simulation, $S_y$,
height of the blank-holder, h,
tensile strength limit of the material used for the simulation, $S_u$,
angle of entry into the deep drawing die, $\alpha$.

5. The forming process according to claim 1, characterized in that a drawing ratio that allows keeping the thickness of the bottom constant throughout all the steps of the forming process is used.

6. The forming process according to claim 1, characterized in that it is implemented to manufacture ammunition cartridge cases.

7. The forming process according to claim 1, further comprising a computer program comprising program code to perform the simulation stages when said program runs in a computer.

8. The forming process according to claim 7, wherein the computer program is copied in a computer-readable medium.

* * * * *